(12) United States Patent
Chiang

(10) Patent No.: US 12,733,149 B2
(45) Date of Patent: Sep. 8, 2026

(54) SEMICONDUCTOR STRUCTURE AND FORMING METHOD THEREOF

(71) Applicant: NANYA TECHNOLOGY CORPORATION, New Taipei city (TW)

(72) Inventor: Chia Che Chiang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 344 days.

(21) Appl. No.: 18/643,533

(22) Filed: Apr. 23, 2024

(65) Prior Publication Data

US 2025/0331158 A1 Oct. 23, 2025

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC ................ H10B 12/315; H10B 12/033; H10B 12/0335; H10B 12/482; H10B 12/30; H10B 12/02; H10B 12/03
See application file for complete search history.

(56) References Cited

U.S. PATENT DOCUMENTS

2021/0366912 A1* 11/2021 Chung ................. H10B 12/315
2022/0262803 A1* 8/2022 Jang ........................ H10B 12/34
2024/0324189 A1* 9/2024 Choi ...................... H10B 12/50
2024/0407157 A1* 12/2024 An ......................... H10B 12/09

FOREIGN PATENT DOCUMENTS

TW 202021042 A 6/2020
TW 202238959 A 10/2022

* cited by examiner

*Primary Examiner* — Jonathan Han
(74) *Attorney, Agent, or Firm* — CKC & Partners Co., LLC

(57) ABSTRACT

The present disclosure provides a semiconductor structure and a forming method thereof. The semiconductor structure includes a plurality of bit-line structures laterally spaced apart on a substrate, a landing pad between the bit-line structures, a metal oxynitride layer covered onto the top surface of the landing pad, and a capacitor structure vertically extending above the landing pad. The method of forming a semiconductor structure includes the following operations. A plurality of bit-line structures on a substrate is received. A landing pad is formed between the bit-line structures. A metal oxynitride layer is formed to cover the top surface of the landing pad. A sacrificial stack is formed on top of the metal oxynitride layer and the bit-line structures. A trench is formed in the sacrificial stack to expose the metal oxynitride layer. A capacitor structure is formed in the trench.

17 Claims, 10 Drawing Sheets

SEMICONDUCTOR STRUCTURE AND FORMING METHOD THEREOF

BACKGROUND

Field of Invention

The present disclosure relates to a semiconductor structure and a forming method of the semiconductor structure.

Description of Related Art

Semiconductor components can be used in various electronic applications, such as computers, cellphones, digital cameras, or other electronic devices. The manufacturing processes of the semiconductor components usually include one or more semiconductor layers, dielectric layers, and conductive layers deposited on the substrate, and then photolithography process is performed to pattern several different material layers. In order to pursue lower costs, higher efficiencies, and higher component densities, the sizes of the semiconductor components are gradually becoming smaller. However, as the semiconductor components keep downsizing, the more problems started to appear, such as the reduced electronic properties, quality, and yield of the semiconductor components. Therefore, how to improve the aforementioned problem is still a big challenge.

SUMMARY

The present disclosure provides a semiconductor structure including a substrate, a plurality of bit-line structures, a landing pad, a metal oxynitride layer, and a capacitor structure. The bit-line structures are laterally spaced apart on the substrate. The landing pad is between the bit-line structures, in which a top surface of the landing pad is higher than a top surface of the bit-line structures. The metal oxynitride layer is covered onto the top surface of the landing pad. The capacitor structure vertically extends above the landing pad, in which a bottom of the capacitor structure contacts the metal oxynitride layer.

In some embodiments, a nitrogen content of the metal oxynitride layer is above 5 wt %.

In some embodiments, a nitrogen content of the metal oxynitride layer is between 20 wt % and 40 wt %.

In some embodiments, an oxygen content of the metal oxynitride layer is between 10 wt % and 30 wt %.

In some embodiments, the metal oxynitride layer is a tungsten oxynitride layer.

In some embodiments, a thickness of the metal oxynitride layer is between 5 angstroms and 30 angstroms.

In some embodiments, the capacitor structure is in a cylinder shape and includes a bottom outer diameter, a top outer diameter, and a middle outer diameter that is greater than the bottom outer diameter and the top outer diameter.

In some embodiments, the bottom outer diameter is smaller than the top outer diameter.

In some embodiments, the top surface of the landing pad is substantially flat.

The present disclosure provides a method of forming a semiconductor structure, and the method includes the following operations. A plurality of bit-line structures is received on a substrate. A landing pad is formed between the bit-line structures, in which a top surface of the landing pad is higher than a top surface of the bit-line structures. A metal oxynitride layer is formed to cover the top surface of the landing pad. A sacrificial stack is formed on top of the metal oxynitride layer and the bit-line structures. A trench is formed in the sacrificial stack to expose the metal oxynitride layer. A capacitor structure is formed in the trench, in which a bottom of the capacitor structure contacts the metal oxynitride layer.

In some embodiments, forming the metal oxynitride layer covering the top surface of the landing pad includes treating the top surface of the landing pad with a forming gas containing hydrogen and nitrogen.

In some embodiments, a nitrogen content of the forming gas is between 4 vol % and 50 vol %.

In some embodiments, forming the sacrificial stack on top of the metal oxynitride layer and the bit-line structures includes sequentially forming a silicon nitride layer, a first dielectric layer, a silicon nitride layer, a second dielectric layer, and a silicon nitride layer on top of the metal oxynitride layer and the bit-line structures.

In some embodiments, the first dielectric layer includes borophosphosilicate glass, and the second dielectric layer includes tetraethyl orthosilicate.

In some embodiments, the method further includes before forming the capacitor structure in the trench, etching the first dielectric layer at a bottom of the trench with an alkaline etchant to remove portions of the first dielectric layer such that a space surrounded by the first dielectric layer is greater than a space surrounded by the second dielectric layer.

In some embodiments, the alkaline etchant is selective for the first dielectric layer over the second dielectric layer.

In some embodiments, forming the capacitor structure in the trench includes sequentially forming an outer capacitor electrode layer, a capacitor dielectric layer, and an inner capacitor electrode layer, in which the outer capacitor electrode layer contacts the metal oxynitride layer.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiments, with reference made to the accompanying drawings.

DETAILED DESCRIPTION

Figure 1:
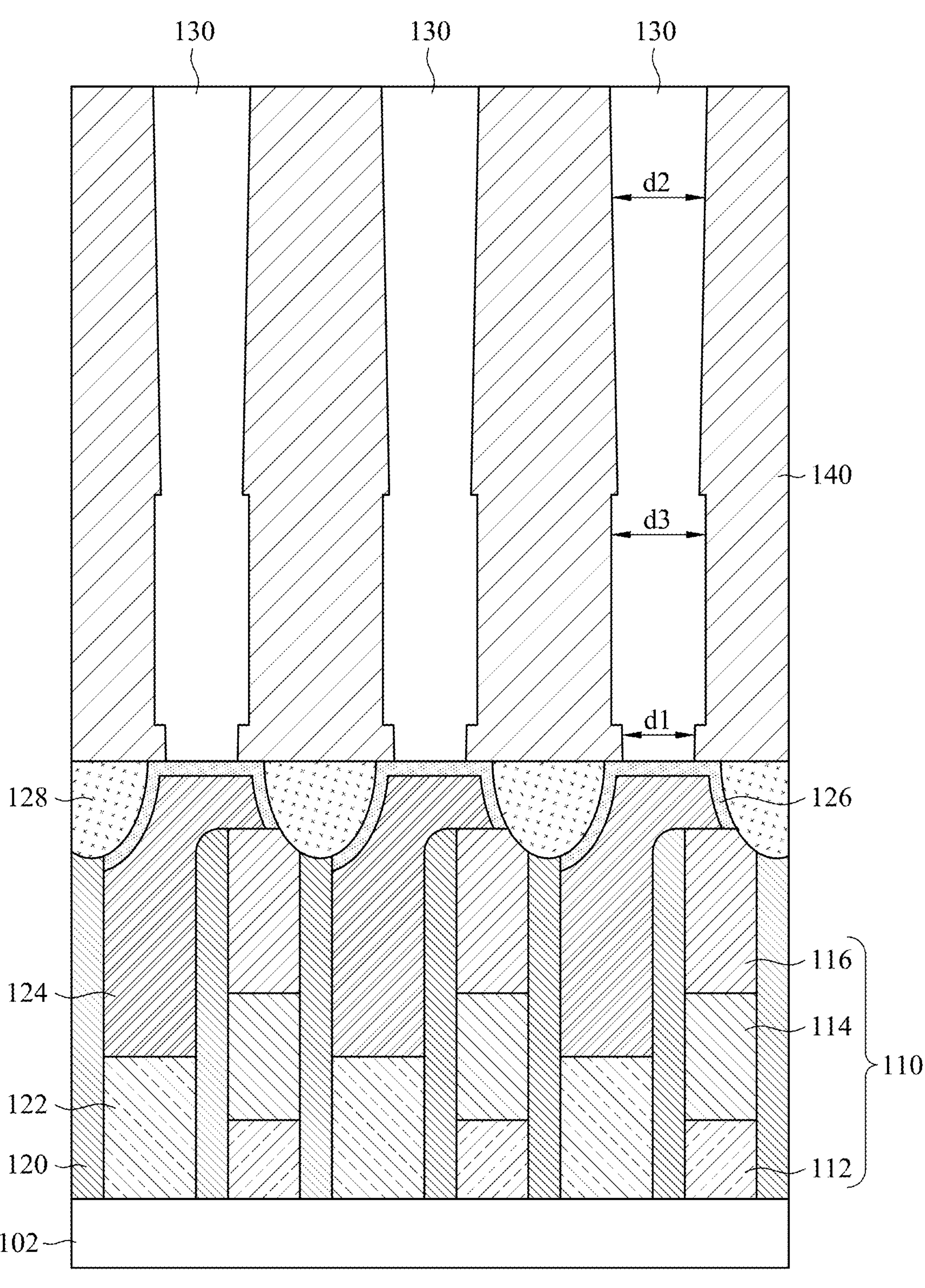
FIG. 1 is a cross-sectional view of a semiconductor structure, in accordance with some embodiments.

Reference will now be made in detail to the present embodiments of the disclosure, examples of which are illustrated in the accompanying drawings. Wherever possible, the same reference numbers are used in the drawings and the description to refer to the same or like parts.

It is appreciated that although the terms "first," "second," "third," etc., may be used in this document to describe different components, parts, regions, layers and/or parts, such components, parts, regions, layers and/or parts shall not be limited by these terms. These terms are used only to distinguish an assembly, part, region, layer, or part from another component, part, region, layer, or part. Therefore, the "first element," "component," "region," "layer," or "section" discussed below may be referred to as a second element, component, region, layer or part without departing from the teachings herein.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure relates to structures which are made up of different layers. When the terms "on" or "upon" or "over" are used with reference to two different layers (including the substrate), they indicate merely that one layer is on or upon the other layer. These terms do not require the two layers to directly contact each other, and permit other layers to be between the two layers. For example, all layers of the structure can be considered to be "on" the substrate, even though they do not all directly contact the substrate.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The present disclosure relates to a metal oxynitride layer covered on a landing pad to prevent the damage of the landing pad by the alkaline etchant. That is to say, the metal oxynitride layer can be considered as a passivation layer to protect the landing pad from being etched by the alkaline etchant.

FIG. 1 is a cross-sectional view of a semiconductor structure 100, in accordance with some embodiments. As shown in FIG. 1, the semiconductor structure 100 includes a substrate 102, bit-line structures 110, spacers 120, a polycrystalline silicon layer 122, landing pads 124, a metal oxynitride layer 126, an etch stop layer 128, capacitor structures 130, and a sacrificial stack 140. In some embodiments, the substrate 102 is a semiconductor substrate, such as a bulk semiconductor, a semiconductor substrate on an insulator, or other similar substrates. In some embodiments, the semiconductor substrate includes an elementary semiconductor, a compound semiconductor material, or an alloy semiconductor material. The elementary semiconductor includes a single crystal form, a polycrystalline form, or an amorphous form of silicon (Si) or germanium (Ge). The compound semiconductor material includes silicon carbide (SiC), gallium arsenide (GaAs), gallium phosphide (GaP), indium phosphide (InP), indium arsenide (InAs), indium antimonide (InSb), other suitable materials, or combinations thereof. The alloy semiconductor material includes silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), other suitable materials, or combinations thereof. In some embodiments, the alloy semiconductor material includes silicon germanium (SiGe) with gradient Ge characteristics, in which the composition of Si and Ge changes from one ratio at one location of the gradient SiGe characteristics to another ratio at another location. In some embodiments, SiGe is formed on a Si substrate. In some embodiments, SiGe is mechanically strained by another material in contact with SiGe. In some embodiments, the substrate 102 may include one or multi-layers of structures or the substrate 102 may include one or multi-layers of semiconductor substrate. It is appreciated that the subject application is not limited to the aforementioned materials.

As shown in FIG. 1, the bit-line structures 110 are laterally spaced apart on the substrate 102. In some embodiments, each of the bit-line structures 110 includes a silicon nitride layer 112, a first conductive layer 114, and a mask layer 116. The first conductive layer 114 is disposed on the silicon nitride layer 112, and the mask layer 116 is disposed on the first conductive layer 114. In some embodiments, the first conductive layer 114 includes metal or alloy materials, such as aluminum (Al), copper (Cu), tungsten (W), titanium (Ti), tantalum (Ta), nickel (Ni), molybdenum (Mo), manganese (Mn), ruthenium (Ru), zirconium (Zr), platinum (Pt), titanium aluminum (TiAl), titanium aluminum nitride (TiAlN), tantalum carbon nitride (TaCN), titanium nitride (TiN), tungsten nitride (WN), tantalum nitride (TaN), titanium silicon nitride (TiSiN), other suitable materials, or combinations thereof. In some embodiments, the mask layer 116 includes silicon nitride ($Si_3N_4$), silicon dioxide, silicon oxynitride, other materials, or combinations thereof. It is appreciated that the bit-line structures 110 and compositions thereof are intended solely as a nonlimiting example implementation. The semiconductor structure 100 may be implemented with any number of bit-line structures 110, e.g., one, two, three, four, five, etc.

As shown in FIG. 1, the spacers 120 are disposed adjacent to the bit-line structures 110 and on the substrate 102. In some embodiments, the spacers 120 are single layers or multi-layers. In some embodiments, the spacers 120 include $Si_3N_4$, silicon dioxide, or a combination thereof.

As shown in FIG. 1, the polycrystalline silicon layer 122 is disposed adjacent to the spacers 120 and on the substrate 102. In some embodiments, a top surface of the polycrystalline silicon layer 122 is lower than the top surface of the bit-line structures 110.

As shown in FIG. 1, the landing pads 124 are disposed between the bit-line structures 110 and on the polycrystalline silicon layer 122. In some embodiments, the top surface of the landing pads 124 is higher than the top surface of the bit-line structures 110. In some embodiments, the landing pads 124 partially cover the top surfaces of the bit-line structures 110. In some embodiments, each of the landing pads 124 has a top surface and two concave surfaces extending downward from the top surface. In some embodiments, the landing pads 124 include metal or alloy materials, such as W, Mo, Al, Cu, Zr, TiAl, TiAlN, TaCN, TiN, WN, TiSiN, other suitable materials, or combinations thereof.

As shown in FIG. 1, the metal oxynitride layer 126 is covered onto the top surfaces of the landing pads 124. In some embodiments, a nitrogen content of the metal oxynitride layer 126 is above 5 wt %. For example, the nitrogen content is above 5 wt % and less than or equal to 40 wt %, such as 10, 15, 20, 25, 30, 35, or 40 wt %. In some embodiments, the nitrogen content of the metal oxynitride layer 126 is between 20 wt % and 40 wt %, such as 20, 22, 24, 26, 28, 30, 32, 34, 36, 38, or 40 wt %. In some embodiments, an oxygen content of the metal oxynitride layer 126 is between 10 wt % and 30 wt %, such as 10, 12, 14, 16, 18, 20, 22, 24, 26, 28, or 30 wt %. In some embodiments, a metal content of the metal oxynitride layer 126 is between 30 wt % and 70 wt %, such as 30, 35, 40, 45, 50, 55, 60, 65, or 70 wt %. In some embodiments, metal species in the metal oxynitride layer 126 is tungsten (W), iron (Fe), cobalt (Co), Ni, Mo, Al, or other suitable metal species. In some embodiments, the metal oxynitride layer 126 is a tungsten oxynitride layer. In some embodiments, a thickness of the metal oxynitride layer 126 is between 5 angstroms (Å) and 30 angstroms (Å), such as 5, 10, 15, 20, 25, or 30 Å. In some embodiments, the metal oxynitride layer 126 is a passivation layer. In some embodiments, the metal oxynitride layer 126 covered on the top surface of the landing pad 124 can protect the landing pad 124 from being etched. In some embodiments, the metal oxynitride layer 126 conformally covers the top surfaces and the concave surfaces of the landing pads 124. The metal oxynitride layer 126 can protect the landing pad 124 from being etching.

As shown in FIG. 1, the etch stop layer 128 is disposed adjacent to the metal oxynitride layer 126. In some embodiments, a bottom of the etch stop layer 128 is in contact with the bit-line structures 110 and the spacers 120. In some embodiments, the etch stop layer 128 includes silicon nitride, metal oxide, or a combination thereof. In some embodiments, the etch stop layer 128 is in contact with the metal oxynitride layer 126. In some embodiments, the etch stop layer 128 has a top surface substantially coplanar with the metal oxynitride layer 126.

As shown in FIG. 1, the capacitor structures 130 vertically extend above the landing pads 124. In some embodiments, a bottom of each capacitor structure 130 is in contact with the metal oxynitride layer 126. In some embodiments, the capacitor structures 130 are in a cylinder shape. In some embodiments, each capacitor structure 130 includes a bottom outer diameter d1, a top outer diameter d2, and a middle outer diameter d3 greater than the bottom outer diameter d1 and the top outer diameter d2. In some embodiments, the bottom outer diameter d1 is smaller than the top outer diameter d2. It is appreciated that the capacitor structures 130 are intended solely as a nonlimiting example implementation. The sacrificial stack 140 is between the capacitor structures 130. In some embodiments, a bottom of the sacrificial stack 140 is in contact with the etch stop layer 128.

Figure 2:
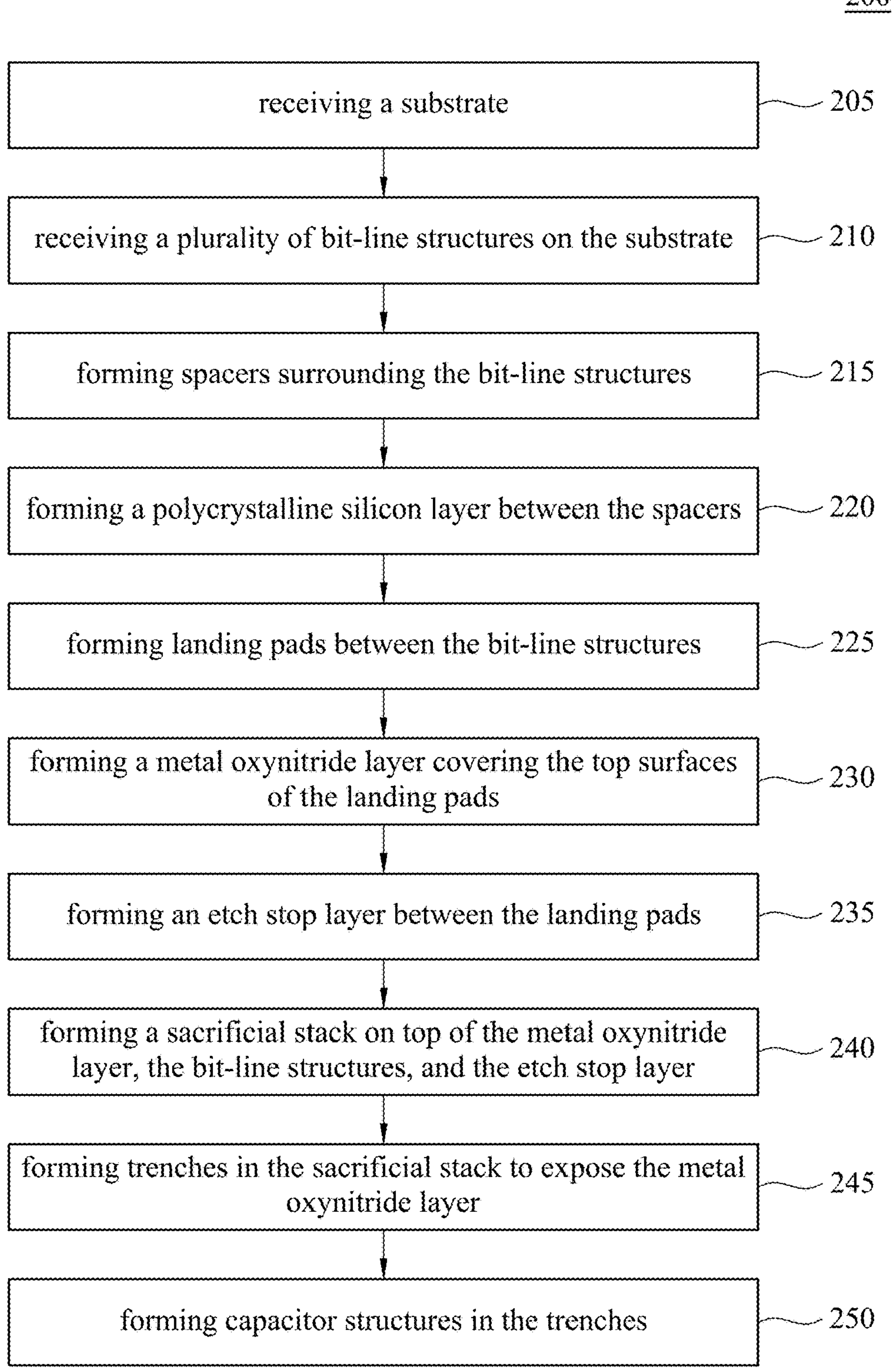
FIG. 2 is a flow diagram of a method of forming a semiconductor structure, in accordance with some embodiments.

FIG. 2 is a flow diagram of a method 200 of forming the semiconductor structure 100, in accordance with some embodiments. The method 200 includes operation 205, operation 210, operation 215, operation 220, operation 225, operation 230, operation 235, operation 240, operation 245, and operation 250. FIGS. 3-9 are cross-sectional views of the semiconductor structure 100 at various stages of its formation, in accordance with some embodiments. Although a series of operations or steps are used below to describe the method disclosed herein, an order of these operations or steps should not be construed as a limitation to the present disclosure. For example, some operations or steps may be performed in a different order, and/or other steps may be performed at the same time. In addition, it is not necessary to perform all of the operations, steps, and/or features shown to achieve the embodiments of the present disclosure. In addition, each operation or step described herein may contain several sub-steps or actions.

Figure 3:
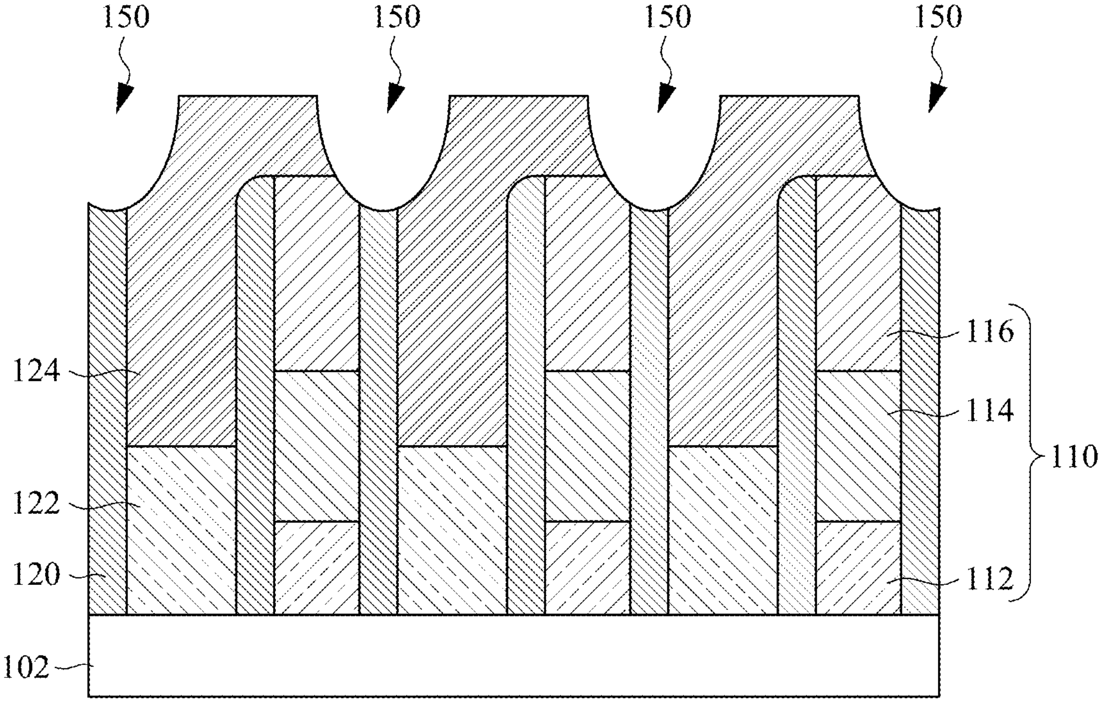
FIGS. 3-9 are cross-sectional views of a semiconductor structure at various stages of its formation, in accordance with some embodiments.

Referring to FIG. 2 and FIG. 3, the method 200 begins with operation 205, the substrate 102 is received. In operation 210, a plurality of bit-line structures 110 are received on the substrate 102. The bit-line structures 110 may be formed by the following operations. Multiple layers (not shown) including a silicon nitride layer, a first conductive layer, and a mask layer are sequentially deposited on the substrate 102 after operation 205. In some embodiments, the silicon nitride layer, the first conductive layer, and the mask layer are deposited by, for example and without limitation, chemical vapor deposition (CVD), physical vapor deposition (PVD), atomic layer deposition (ALD), sputtering, low pressure CVD (LPCVD), another deposition process, or any suitable combination thereof. The silicon nitride layer, the first conductive layer, and the mask layer are etched to form the bit-line structures 110 including the silicon nitride layer 112, the first conductive layer 114, and the mask layer 116. In some embodiments, the layers are etched by, for example and without limitation, an etching process implemented as a wet etching process, dry etching process, reactive-lon etching process, other etching processes, or combinations thereof.

Continuously referring to FIG. 2 and FIG. 3, before the layers are etched, a layer of photoresist (not shown) is deposited and patterned on the layers. That is, the photoresist may be deposited and then selectively exposed via a mask to visible light, ultraviolet light, deep ultraviolet light (i.e., DUV lithography), extreme ultraviolet light (i.e., EUV lithography), or so forth, followed by development of the exposed photoresist, resulting in the patterned photoresist. The layers unprotected by the patterned photoresist are then removed by the aforementioned etching process, followed by the removal of the photoresist by plasma ashing process, solvent such as N-methyl-2-pyrrolidone, or other suitable methods to form the bit-line structures 110. In some embodiments, the patterned photoresist is used for defining the position of the bit-line structures 110.

Continuously referring to FIG. 2 and FIG. 3, in operation 215, the spacers 120 are formed to surround the bit-line structures 110. In detail, a conformal spacer layer (not shown) is deposited and then partially etched to form the spacers 120 surrounding the bit-line structures 110. In some embodiments, the conformal spacer layer includes dielectric materials such as silicon dioxide, silicon nitride ($Si_3N_4$), silicon oxynitride, silicon carbonitride, silicon oxycarbide, silicon oxycarbonitride, aluminum oxide, a low-k material, or combinations thereof. In some embodiments, the conformal spacer layer is deposited by, for example and without limitation, CVD, PVD, ALD, sputtering, LPCVD, another deposition process, or any suitable combination thereof. In some embodiments, the conformal spacer layer is etched by, for example without limitation, an etching process implemented as a wet etching process, dry etching process, reactive-lon etching process, other etching processes, or combinations thereof. In some embodiments, before the conformal spacer layer is etched, a layer of photoresist (not shown) is deposited and patterned on the conformal spacer layer. That is, the photoresist may be deposited and then selectively exposed via a mask to visible light, ultraviolet light, deep ultraviolet light (i.e., DUV lithography), extreme ultraviolet light (i.e., EUV lithography), or so forth, followed by development of the exposed photoresist, resulting in the patterned photoresist. The conformal spacer layer unprotected by the patterned photoresist are then removed by the aforementioned etching process, followed by the removal of the photoresist by plasma ashing process, solvent such as N-methyl-2-pyrrolidone, or other suitable methods to form the spacers 120. In some embodiments, the horizontal sections of the conformal spacer layer is etched and removed to form the spacers 120 surrounding the bit-line structures 110, as shown in FIG. 3.

Continuously referring to FIG. 2 and FIG. 3, in operation 220, the polycrystalline silicon layer 122 is formed between the spacers 120. In detail, a polycrystalline silicon layer (not shown) is formed by deposition and followed by etching process. The polycrystalline silicon layer is formed by deposition, for example and without limitation, CVD, PVD, ALD, sputtering, LPCVD, another deposition process, or any suitable combination thereof. The polycrystalline silicon layer is patterned by etching process such as wet etching process, dry etching process, reactive-lon etching process, other etching processes, or combinations thereof to form the polycrystalline silicon layer 122. In some embodiments, before the polycrystalline silicon layer is etched, a layer of photoresist (not shown) is deposited and patterned on the conformal spacer layer. That is, the photoresist may be deposited and then selectively exposed via a mask to visible light, ultraviolet light, deep ultraviolet light (i.e., DUV lithography), extreme ultraviolet light (i.e., EUV lithography), or so forth, followed by development of the exposed photoresist, resulting in the patterned photoresist. The polycrystalline silicon layer unprotected by the patterned photoresist are then removed by the aforementioned etching process, followed by the removal of the photoresist by plasma ashing process, solvent such as N-methyl-2-pyrrolidone, or other suitable methods.

Continuously referring to FIG. 2 and FIG. 3, in operation 225, the landing pads 124 are formed between the bit-line structures 110. In some embodiments, the landing pads 124 are formed on the polycrystalline silicon layer 122. In some embodiments, the landing pads 124 are formed by the following operations. A second conductive layer (not shown) is deposited on the polycrystalline silicon layer 122, the bit-line structures 110, and the spacers 120. Afterwards, the second conductive layer is planarized etched to form the landing pads 124. In some embodiments, the second conductive layer includes W, Mo, Al, Cu, Zr, TiAl, TiAlN, TaCN, TIN, WN, TiSiN, other suitable materials, or combinations thereof. In some embodiments, the second conductive layer is deposited by, for example and without limitation, CVD, PVD, ALD, sputtering, LPCVD, another deposition process, or any suitable combination thereof. In some embodiments, a top surface of the second conductive layer is not flat. In some embodiments, the second conductive layer is planarized by chemical mechanical planarization (CMP). In some embodiments, the etching process is used for the formation of openings 150, in which the etching process includes wet etching process, dry etching process, reactive-lon etching process, other etching processes, or combinations thereof. In some embodiments, partial mask layers 116 and partial spacers 120 are removed by the etching process. In some embodiments, the mask layers 116 respectively have a concave surface exposed from the openings 150. In some embodiments, the spacers 120 respectively have a concave surface exposed from the openings 150.

Figure 4:
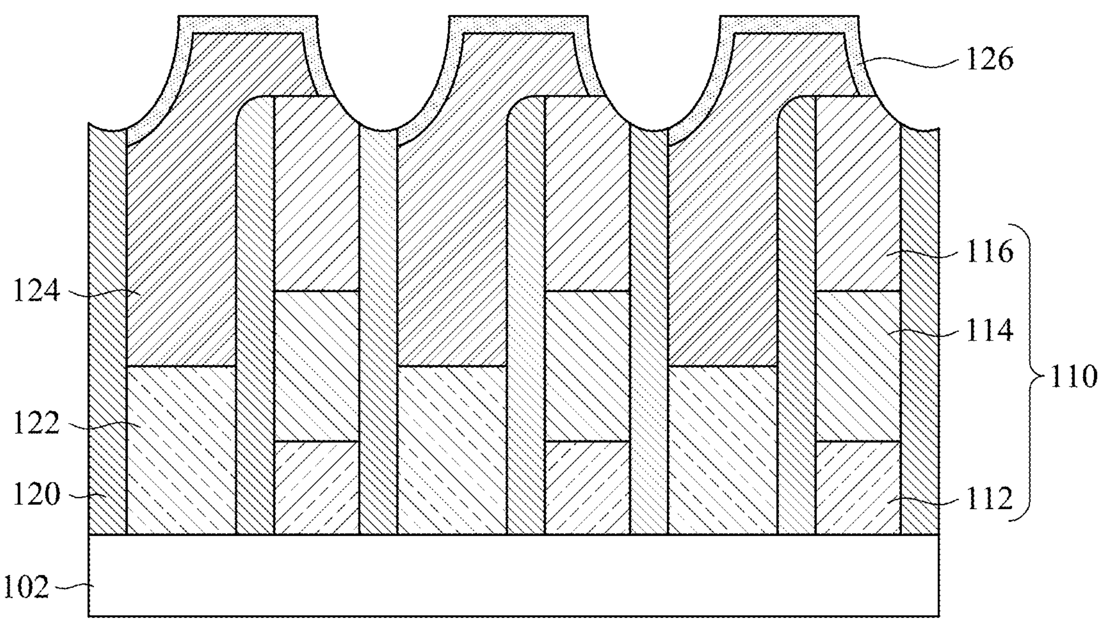

Referring to FIG. 2 and FIG. 4, in operation 230, the metal oxynitride layer 126 is formed and covers the top surfaces of the landing pads 124. In some embodiments, the metal oxynitride layer 126 is formed by treating the top surfaces of the landing pads 124 with a forming gas. In some embodiments, the forming gas contains hydrogen and nitrogen. In some embodiments, a nitrogen content of the forming gas is between 4 vol % and 50 vol %, such as 4, 6, 8, 10, 12, 14, 16, 18, 20, 22, 24, 26, 28, 30, 32, 34, 36, 40, 42, 44, 46, 48, or 50 vol %. In some embodiments, the metal oxynitride layer 126 protects the landing pads 124 from being etching in the subsequent process. In some embodiments, the forming gas includes ammonia ($NH_3$) or the mixture of hydrogen gas ($H_2$) and nitrogen gas ($N_2$).

Figure 5:
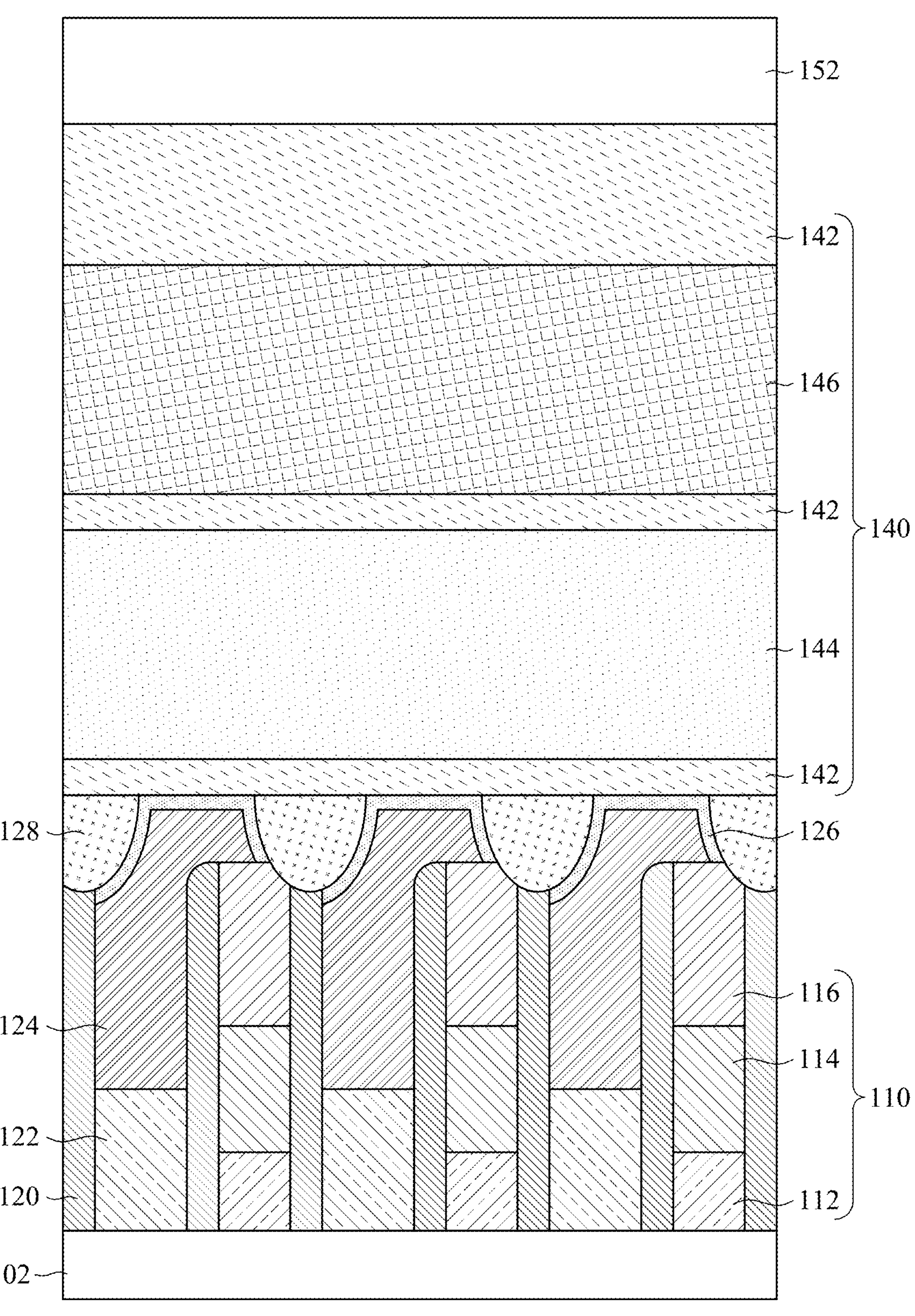

Referring to FIG. 2 and FIG. 5, in operation 235, the etch stop layer 128 is formed between the landing pads 124. In detail, the etch stop layer 128 is deposited on the metal oxynitride layer 126, the bit-line structures 110, and the spacers 120, followed by the etching process of the etch stop layer 128. In some embodiments, the etch stop layer 128 is deposited by, for example and without limitation, CVD, PVD, ALD, sputtering, LPCVD, another deposition process, or any suitable combinations thereof. In some embodiments, the etching process includes wet etching process, dry etching process, reactive-lon etching process, other etching processes, or a combination thereof. In some embodiments, a top surface of the etch stop layer 128 is aligned with a top surface of the metal oxynitride layer 126.

Continually referring to FIG. 2 and FIG. 5, in operation 240, the sacrificial stack 140 is formed on top of the metal oxynitride layer 126, the bit-line structures 110, and the etch stop layer 128. In some embodiments, the sacrificial stack 140 is formed by sequentially forming a silicon nitride layer 142, a first dielectric layer 144, a silicon nitride layer 142, a second dielectric layer 146, and a silicon nitride layer 142 on top of the metal oxynitride layer 126 and the bit-line structures 110, and the etch stop layer 128. In some embodiments, the first dielectric layer 144, the silicon nitride layer 142, and the second dielectric layer 146 are formed by the deposition process, such as CVD, PVD, ALD, sputtering, LPCVD, another deposition process, or any suitable combinations thereof. In some embodiments, the first dielectric layer 144 includes borophosphosilicate glass. In some embodiments, the second dielectric layer 146 includes tetraethyl orthosilicate.

Figure 6:
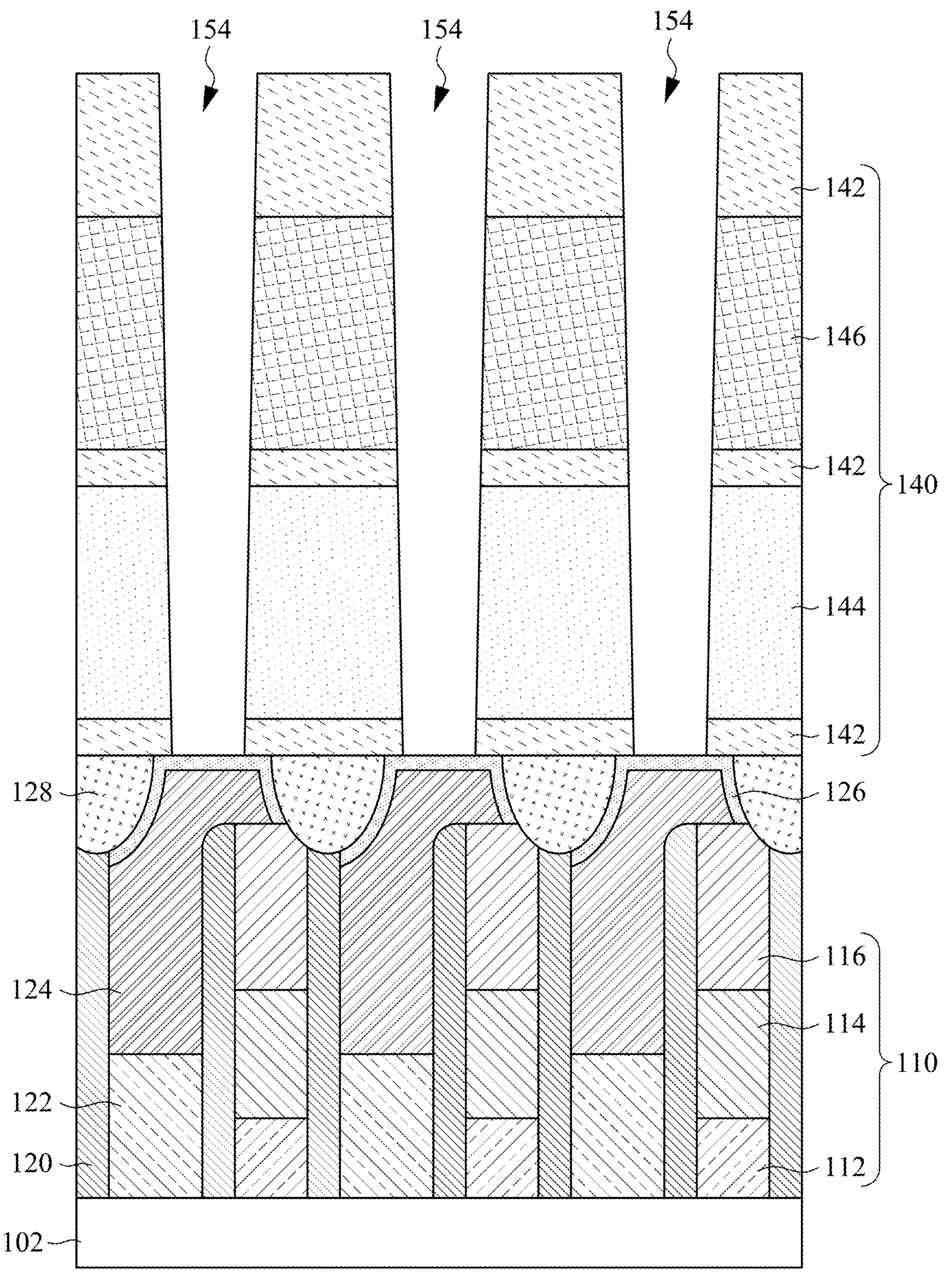

Referring to FIG. 2, FIG. 5, and FIG. 6, in operation 245, the trenches 154 are formed in the sacrificial stack 140 to expose the metal oxynitride layer 126. In some embodiments, before the trenches 154 are formed, a layer of photoresist (not shown) is deposited and patterned on the sacrificial stack 140. That is, the photoresist may be deposited and then selectively exposed via a mask 152 to visible light, ultraviolet light, deep ultraviolet light (i.e., DUV lithography), extreme ultraviolet light (i.e., EUV lithography), or so forth, followed by development of the exposed photoresist, resulting in the patterned photoresist. The sacrificial stack 140 unprotected by the patterned photoresist are then removed by the etching process such as wet etching process, dry etching process, reactive-lon etching process, other etching processes, or a combination thereof, followed by the removal of the photoresist by plasma ashing process, solvent such as N-methyl-2-pyrrolidone, or other suitable methods to form the trenches 154. It is noted that the metal oxynitride layer 126 can protect the landing pads 124 from being etching.

Figure 7:
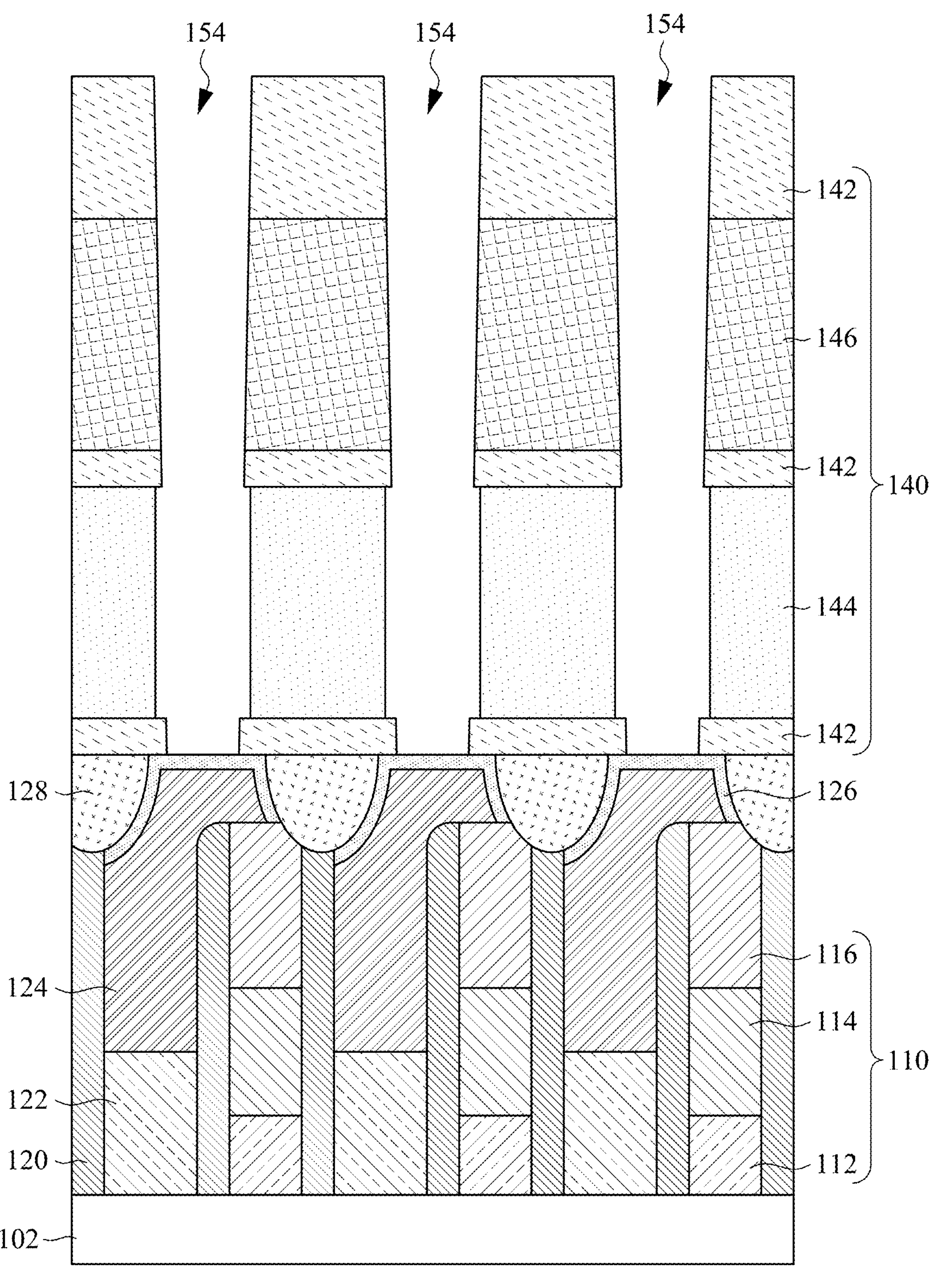

Referring to FIG. 2 and FIG. 7, after operation 245, the first dielectric layer 144 at the bottoms of the trenches 154 is etched with an alkaline etchant to remove portions of the first dielectric layer 144 such that the spaces surrounded by the first dielectric layer 144 are greater than the spaces surrounded by the second dielectric layer 146. In some embodiments, the alkaline etchant includes sodium hydroxide (NaOH), potassium hydroxide (KOH), ammonium hydroxide ($NH_4OH$), tetramethyl ammonium hydroxide (TMAH, $N(CH_3)_4OH$), other suitable alkaline etchant, or a combination thereof. In some embodiments, the alkaline etchant is selective for the first dielectric layer 144 over the second dielectric layer 146. It is noted that the metal oxynitride layer 126 can protect the landing pads 124 from being etching by the alkaline etchant.

Figure 8:
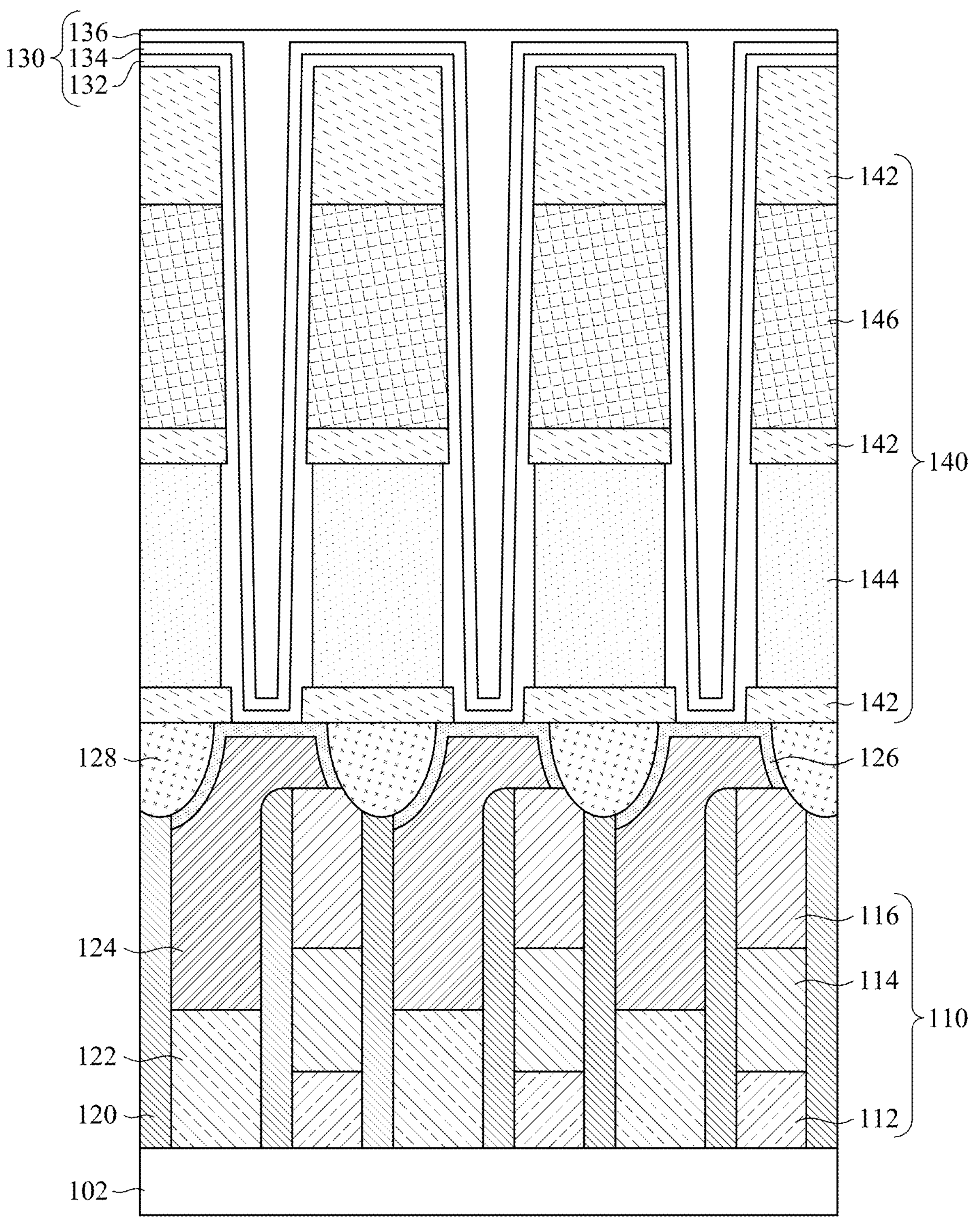
Figure 9:
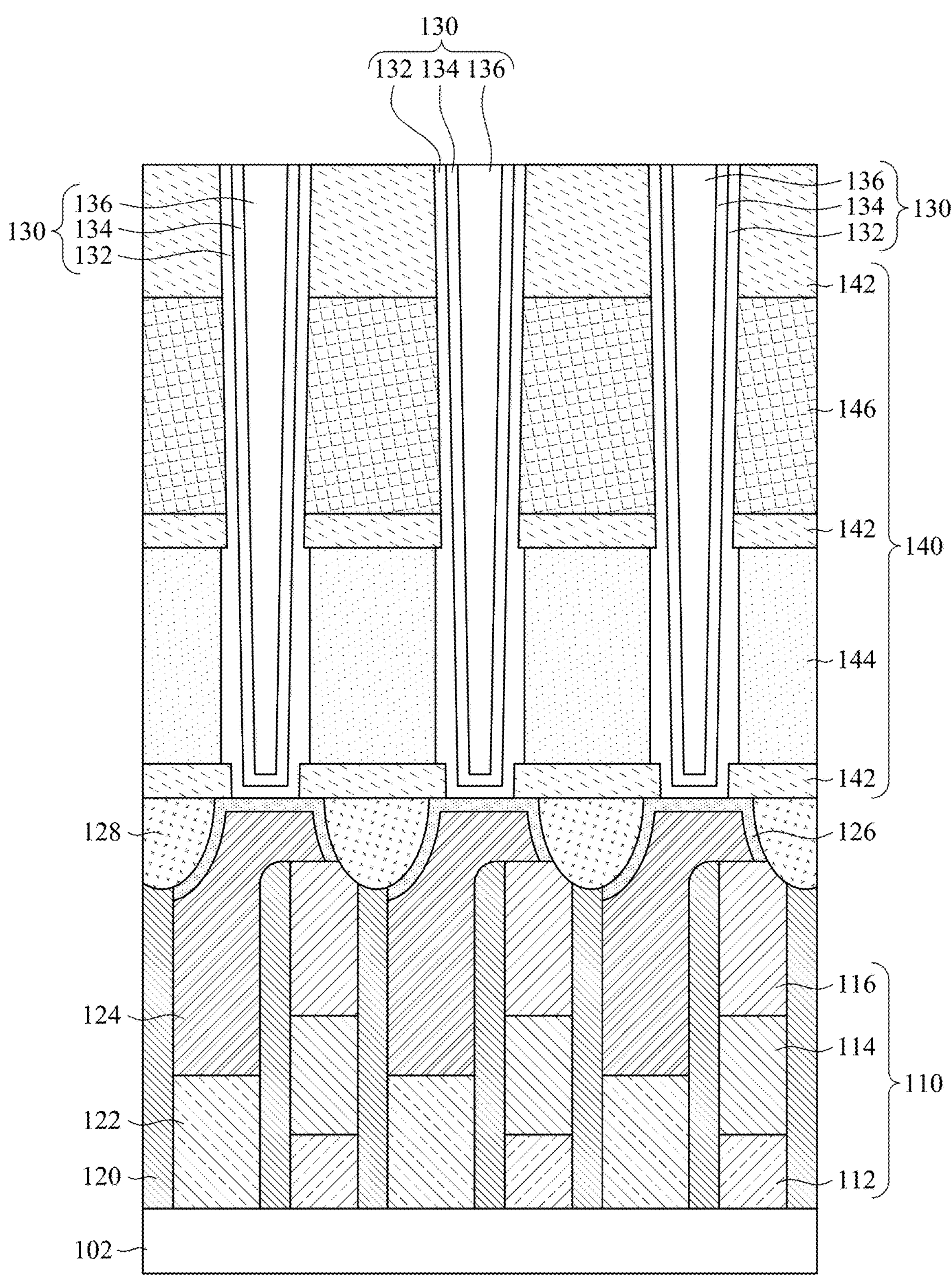

Referring to FIG. 2 and FIG. 8, in operation 250, the capacitor structures 130 are formed in the trenches 154. In some embodiments, the bottoms of the capacitor structures 130 are in contact with the top of the metal oxynitride layer 126. In some embodiments, each capacitor structures 130 includes the outer capacitor electrode layer 132, the capacitor dielectric layer 134, and the inner capacitor electrode layer 136, which are sequentially formed. In some embodiments, the outer capacitor electrode layer 132 is in contact with the metal oxynitride layer 126. In some embodiments, the outer capacitor electrode layer 132, the capacitor dielectric layer 134, and the inner capacitor electrode layer 136 are formed by the deposition process, for example and without limitation, CVD, PVD, ALD, sputtering, LPCVD, another deposition process, or any suitable combination thereof. As shown in FIG. 9, after operation 250, the capacitor structures 130 are planarized until the top surface of the capacitor structure 130 is aligned with the sacrificial stack 140. In some embodiments, the capacitor structure is planarized by, for example, CMP.

Figure 10A:
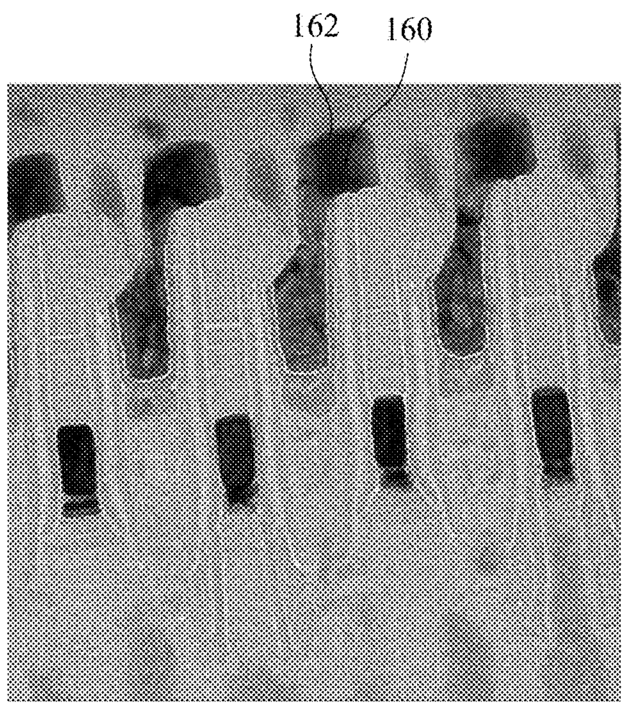
FIGS. 10A-10B are scanning electron microscope graphs of semiconductor structures in accordance with some embodiments.
Figure 10B:
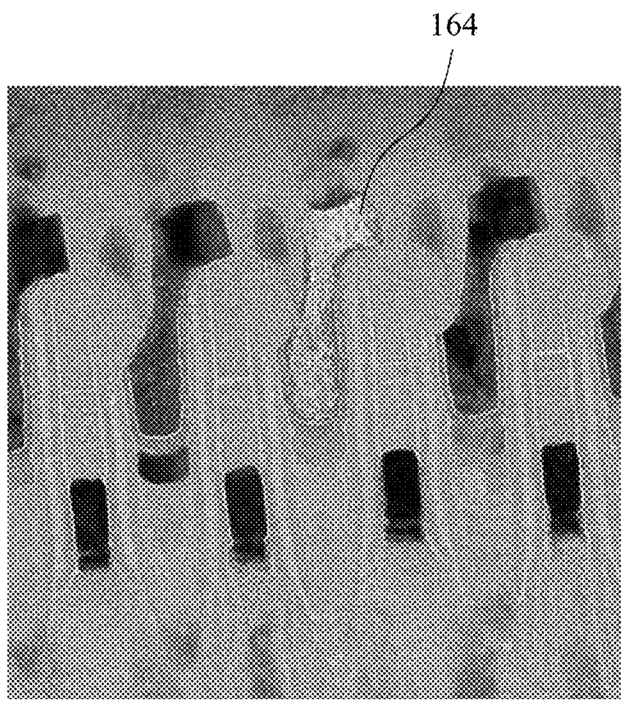

FIGS. 10A-10B are scanning electron microscope graphs of semiconductor structures in accordance with some embodiments. In FIG. 10A, the landing pad 160 is covered and protected by the metal oxynitride layer 162. In FIG. 10B, the landing pad 164 is not covered by any metal oxynitride layer. Compared FIG. 10A to FIG. 10B, in FIG. 10A, the landing pad 160 is substantially undamaged and forms black. On the contrary, in FIG. 10B, the landing pad 164 is etched with a depth of 25 Å and forms white. The white area formed in the landing pad 164 illustrates the landing pad 164 is damaged, as shown in FIG. 10B. As shown in FIG. 10A, it can be seen that the metal oxynitride layer 162 covered onto the landing pad 160 can prevent the landing pad 160 from being damaged, as shown in FIG. 10A. However, in FIG. 10B, the lack of a metal oxynitride layer covering on the landing pad 164 may cause disappearance of the landing pad 164. Thus, the metal oxynitride layer can protect the landing pad from being damaged and etched.

In summary, the present disclosure provides a semiconductor structure and a method of forming the semiconductor structure. In the semiconductor structure, the metal oxynitride layer covered on the landing pad can be considered as a passivation layer to protect the landing pad from being damaged or etched by, for example, the alkaline etchant. Therefore, by disposing the metal oxynitride layer on the landing pad can overcome the aforementioned problems, which can form the semiconductor structure with better quality and high yield.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
- a plurality of bit-line structures laterally spaced apart on a substrate;
- a landing pad between the bit-line structures, wherein a top surface of the landing pad is higher than a top surface of the bit-line structures;
- a metal oxynitride layer covered onto the top surface of the landing pad; and
- a capacitor structure vertically extending above the landing pad, wherein a bottom of the capacitor structure contacts the metal oxynitride layer.

2. The semiconductor structure of claim 1, wherein a nitrogen content of the metal oxynitride layer is above 5 wt %.

3. The semiconductor structure of claim 1, wherein a nitrogen content of the metal oxynitride layer is between 20 wt % and 40 wt %.

4. The semiconductor structure of claim 1, wherein an oxygen content of the metal oxynitride layer is between 10 wt % and 30 wt %.

5. The semiconductor structure of claim 1, wherein the metal oxynitride layer is a tungsten oxynitride layer.

6. The semiconductor structure of claim 1, wherein a thickness of the metal oxynitride layer is between 5 angstroms and 30 angstroms.

7. The semiconductor structure of claim 1, wherein the capacitor structure is in a cylinder shape and comprises:
- a bottom outer diameter;
- a top outer diameter; and
- a middle outer diameter that is greater than the bottom outer diameter and the top outer diameter.

8. The semiconductor structure of claim 7, wherein the bottom outer diameter is smaller than the top outer diameter.

9. The semiconductor structure of claim 1, wherein the top surface of the landing pad is substantially flat.

10. A method of forming a semiconductor structure, comprising:
- receiving a plurality of bit-line structures on a substrate;
- forming a landing pad between the bit-line structures, wherein a top surface of the landing pad is higher than a top surface of the bit-line structures;
- forming a metal oxynitride layer covering the top surface of the landing pad;
- forming a sacrificial stack on top of the metal oxynitride layer and the bit-line structures;
- forming a trench in the sacrificial stack to expose the metal oxynitride layer; and
- forming a capacitor structure in the trench, wherein a bottom of the capacitor structure contacts the metal oxynitride layer.

11. The method of claim 10, wherein forming the metal oxynitride layer covering the top surface of the landing pad comprises treating the top surface of the landing pad with a forming gas containing hydrogen and nitrogen.

12. The method of claim 11, wherein a nitrogen content of the forming gas is between 4 vol % and 50 vol %.

13. The method of claim 10, wherein forming the sacrificial stack on top of the metal oxynitride layer and the bit-line structures comprises sequentially forming a silicon nitride layer, a first dielectric layer, a silicon nitride layer, a second dielectric layer, and a silicon nitride layer on top of the metal oxynitride layer and the bit-line structures.

14. The method of claim 13, wherein the first dielectric layer comprises borophosphosilicate glass, and the second dielectric layer comprises tetraethyl orthosilicate.

15. The method of claim 13, further comprising, before forming the capacitor structure in the trench, etching the first dielectric layer at a bottom of the trench with an alkaline etchant to remove portions of the first dielectric layer such that a space surrounded by the first dielectric layer is greater than a space surrounded by the second dielectric layer.

16. The method of claim 15, wherein the alkaline etchant is selective for the first dielectric layer over the second dielectric layer.

17. The method of claim 10, wherein forming the capacitor structure in the trench comprises sequentially forming an outer capacitor electrode layer, a capacitor dielectric layer, and an inner capacitor electrode layer, wherein the outer capacitor electrode layer contacts the metal oxynitride layer.

* * * * *